US006818373B2

(12) United States Patent
Suda et al.

(10) Patent No.: US 6,818,373 B2
(45) Date of Patent: Nov. 16, 2004

(54) COATING FLUID FOR PRINTING PLATES AND METHOD OF MAKING A PRINTING PLATE

(75) Inventors: Yasuharu Suda, Hiroshima-ken (JP); Hideaki Sakurai, Hiroshima-ken (JP); Toyoshi Ohto, Hiroshima-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 49 days.

(21) Appl. No.: 10/224,437

(22) Filed: Aug. 21, 2002

(65) Prior Publication Data

US 2003/0041759 A1 Mar. 6, 2003

(30) Foreign Application Priority Data

Sep. 6, 2001 (JP) ....................................... 2001-270039

(51) Int. Cl.[7] ............................................. G03F 07/004
(52) U.S. Cl. ..................... 430/138; 430/270.1; 430/964
(58) Field of Search .............................. 430/138, 270.1, 430/271.1, 281.1, 302, 944, 945, 964

(56) References Cited

U.S. PATENT DOCUMENTS 6,318,264 B1 11/2001 D'Heureuse et al. ....... 101/467
6,641,976 B2 * 11/2003 Vermeersch et al. ..... 430/270.1
2002/0157552 A1 * 10/2002 Suda et al. .............. 101/463.1

FOREIGN PATENT DOCUMENTS

| | | |
|---|---|---|
| EP | 0770495 A1 | 5/1997 |
| EP | 0770496 A1 | 5/1997 |
| EP | 1084863 A1 | 3/2001 |
| EP | 1253008 A2 | 10/2002 |
| JP | 2000-6360 | 1/2000 |
| JP | 2000-225780 | 8/2000 |

OTHER PUBLICATIONS

European Search Report dated Mar. 6, 2003.

* cited by examiner

*Primary Examiner*—Barbara Gilliam
(74) *Attorney, Agent, or Firm*—Armstrong, Kratz, Quintos, Hanson & Brooks, LLP

(57) ABSTRACT

A coating fluid for printing plates which can be suitably used to make printing plates that permit images to be written in response to input digital data and that can be easily regenerated and reused. This coating fluid for printing plates comprises at least a carrier liquid, thermoplastic resin particles and an IR absorber, and the IR absorber has a decomposition starting temperature higher than the melt starting temperature of the thermoplastic resin particles.

3 Claims, 4 Drawing Sheets

1: BASE MATERIAL
2: INTERMEDIATE LAYER
3: COATING LAYER
4: ORGANIC COMPOUND LAYER

1: BASE MATERIAL
2: INTERMEDIATE LAYER
3: COATING LAYER

COATING FLUID FOR PRINTING PLATES AND METHOD OF MAKING A PRINTING PLATE

FIELD OF THE INVENTION AND RELATED ART STATEMENT

This invention relates to coating fluids for printing plates and a method of making a printing plate. More particularly, this invention relates to a coating fluid used to make printing plates which permit images to be written in response to input digital data and which can be easily regenerated and reused, as well as a method of making a printing plate by using this coating fluid.

Recently, the printing process is increasingly converted to digital form in the general field of printing technology. According to this digital technology, an image or manuscript is prepared on a personal computer or an image is read with a scanner or the like to convert the image data to digital form, and a printing plate is made directly from such digital data. Thus, a saving of labor can be achieved throughout the printing process and highly precise printing can be easily made.

Conventionally, so-called PS plates (presensitized plates) having a hydrophilic non-image area comprising anodized aluminum and a hydrophobic image area formed by curing a photosensitive resin on the surface thereof have been commonly used as printing plates.

When such PS plates are used, a plurality of steps are required to make printing plates, so that plate making consumes much time and involves considerable costs. Consequently, it is difficult to push forward a shortening of the time required for the printing process and a reduction in printing costs. In particular, the use of PS plates for the printing of a small number of copies causes an increase in printing costs. Moreover, PS plates require a development step using a developing solution. Not only this development step requires much labor, but also the disposal of waste liquor from the development step poses an important problem from the viewpoint of the prevention of environmental pollution.

Moreover, a PS plate is generally exposed to light by preparing a film having an original image pierced therethrough and bringing this film into close contact with the plate surface. This constitutes an obstacle to the preparation of a printing plate directly from digital data, i.e. the promotion of digital printing technology. Another problem is that, after the printing of one image is finished, the plate must be replaced for the next printing step and is hence discarded.

Furthermore, other known methods of making a printing plate include, for example, a method in which a laser absorption layer comprising carbon black or the like and a silicone resin layer are successively applied to a PET (polyethylene terephthalate) film, an image is written with a laser beam to generate heat from the laser absorption layer, and the silicone resin layer is burned off by that heat to make a printing plate; and a method in which a lipophilic laser absorption layer is applied to an aluminum plate, a hydrophilic layer is further applied thereto, and the hydrophilic layer is burned off with a laser beam in the same manner as described above to make a printing plate.

In addition, a method of making a printing plate by using a plate comprising a hydrophilic polymer and irradiating it with light according to image data so as to lipophilize the irradiated part has been proposed.

According to these methods, printing plates can be made directly from digital data. However, after the printing of one image is finished, the plate must be replaced by a new one for the next printing step. Accordingly, they are not essentially different in that the printing plates once used are discarded.

Thus, printing plates which permit images to be written with light such as infrared radiation (IR) are known, but most of them cannot be regenerated. Recently, a system which permits image writing with IR and plate regeneration has been proposed. In this system, however, a photocatalyst is not used as a component of a printing plate. Accordingly, as a means for regenerating a plate after completion of printing, it is employed to wash off the image area adhering to the substrate solely by use of cleaning fluids. Consequently, this system cannot be said to be convenient, for example, in that a variety of cleaning fluids must be used in large amounts.

Meanwhile, several inventions relating to regenerable printing plates using a titanium dioxide photocatalyst have been published, and it is set forth in most of them that the titanium dioxide itself can be hydrophobized by the application of heat. However, it is very difficult in theory to hydrophobize a titanium dioxide photocatalyst by the application of heat. The sole instance in which the hydrophobization of a titanium dioxide photocatalyst is considered to be basically possible is the case in which a titanium dioxide photocatalyst having Cr ions injected thereinto is exposed to visible light. However, since a long time is required for the purpose of hydrophilic-hydrophobic conversion, it is practically difficult to apply this method to plate regeneration.

On the other hand, there have also been proposed a technique for making a printing plate in which a $TiO_2$ photocatalyst is made hydrophilic by irradiation with ultraviolet radiation (UV) and at least a part of the photocatalyst is hydrophobized by the application of heat to form a latent image, and such a technique in which light such as IR is used as the heating means.

However, the hydrophilization of a $TiO_2$ photocatalyst by the application of heat has been published by Prof. Fujishima (at the University of Tokyo) and others. Accordingly, it has been basically impossible to carry out image writing or plate regeneration on the basis of the hydrophobization of $TiO_2$ by the application of heat.

OBJECT AND SUMMARY OF THE INVENTION

In view of the above-described problems, an object of the present invention is to provide a coating fluid for printing plates containing thermoplastic resin particles and, more particularly, a coating fluid for printing plates which is suitable for use in a method for writing images on a regenerable printing plate using a $TiO_2$ photocatalyst with IR that is inert light to the photocatalyst, and a method of making a printing plate by using the coating fluid for printing plates.

A coating fluid for printing plates in accordance with the present invention comprises at least a carrier liquid, thermoplastic resin particles and an IR absorber, and the IR absorber has a decomposition starting temperature higher than the melt starting temperature of the thermoplastic resin particles.

When the coating fluid for printing plates in accordance with the present invention is used, the heat converted by the IR absorber is not absorbed by the absorber itself before the thermoplastic resin particles begin to melt, so that the heat converted by the IR absorber can be efficiently absorbed by the thermoplastic resin particles to melt them rapidly. Consequently, the required output of an image writing apparatus using IR can be reduced to achieve a reduction in the cost of the apparatus and a saving of energy.

The aforesaid IR absorber may be contained in or attached to the thermoplastic resin particles.

Then, it is preferable that the light absorptivity of the composite material consisting of the IR absorber and the thermoplastic resin have a peak at a wavelength of 800 to 850 nm and preferably about 830 nm.

The present invention also relates to a method of making a printing plate by forming a hydrophobic image area in at least a part of a hydrophilic printing plate surface containing a photocatalyst. This method comprising a hydrophobizing agent application step for applying a coating fluid for printing plates, as a hydrophobizing agent, to the plate surface, the coating fluid for printing plates comprising at least a carrier liquid, thermoplastic resin particles and an IR absorber, the IR absorber having a decomposition starting temperature higher than the melt starting temperature of the thermoplastic resin particles; an image writing step for forming a hydrophobic image area by heat-treating at least a part of the plate surface; and a hydrophobizing agent removal step for removing the hydrophobizing agent applied to other areas of the plate surface than the hydrophobic image area.

According to the present method of making a printing plate by using the aforesaid coating fluid for printing plates as a hydrophobizing agent, a hydrophobic image area can be efficiently formed by use of IR light. That is, it is possible to make printing plates having high efficiency in the utilization of IR energy and a high speed of image writing with IR. Moreover, an enhancement in image writing speed makes it possible to shorten the time required for the preparation of plate making and thereby improve the operating efficiency of the printing machine.

The aforesaid photocatalyst preferably comprises titanium dioxide and, in particular, anatase type titanium dioxide.

Moreover, the aforesaid IR absorber may be contained in or attached to the thermoplastic resin particles.

Then, it is preferable that the light absorptivity of the composite material consisting of the IR absorber and the thermoplastic resin have a peak at a wavelength of 800 to 850 nm and preferably about 830 nm.

DETAILED DESCRIPTION OF PREFERRED EMBODIMENTS

Specific embodiments of the coating fluid for printing plates in accordance with the present invention and the method of making a printing plate in accordance with the present invention are described hereinbelow with reference to the accompanying drawings.

The coating fluid for printing plates in accordance with the present invention comprises at least a carrier liquid, thermoplastic resin particles and an IR absorber.

The IR (infrared) absorber functions to absorb IR and convert the light energy of IR to heat. If the decomposition starting temperature of thus IR absorber is lower than the melt starting temperature of the thermoplastic resin particles, its heating efficiency for the thermoplastic resin will be reduced. The reason for this is explained below with reference to FIG. 1 showing the TG-DTA curves of IR absorbers.

Figure 1:
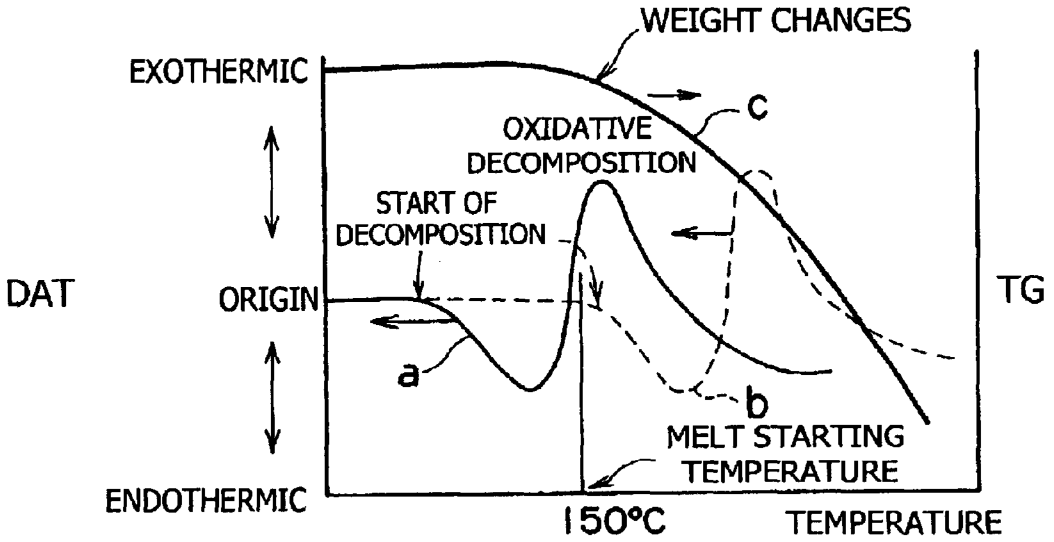
FIG. 1 is a graph showing the TG-DTA curves of exemplary IR absorbers.

In FIG. 1, the symbol "a" represents the DTA curve of an IR absorber having a decomposition starting temperature lower than the melt starting temperature of the thermoplastic resin particles (150° C. in this instance), the symbol "b" represents the DTA curve of an IR absorber having a decomposition starting temperature higher than the aforesaid melt starting temperature, and the symbol "c" shows weight changes (a TG curve) occurring when an IR absorber having the characteristics defined by curve a is heated.

When the aforesaid IR absorber having the characteristics defined by curve a is used, the IR absorber itself absorbs heat for the purpose of its own decomposition before the thermoplastic resin begins to melt. Consequently, the thermal energy applied to the thermoplastic resin by IR writing cannot be effectively used to melt thermoplastic resin particles.

Accordingly, the coating fluid for printing plates in accordance with this embodiment uses an IR absorber having the DTA characteristics defined by curve b.

According to the present invention in which the coating fluid for printing plates uses such an IR absorber, the heat converted from light by the IR absorber is not absorbed by the absorber itself before the thermoplastic resin begins to melt. That is, the aforesaid heat is entirely absorbed by thermoplastic resin particles and hence utilized effectively to melt them.

Accordingly, when the aforesaid coating fluid for printing plates in accordance with the present invention is used as a hydrophobizing agent to be applied to the plate surface containing a photocatalyst, a hydrophobic image area can be efficiently formed by use of IR light. This reduces the required output of an image writing apparatus using IR and thereby achieves a reduction in the cost of the apparatus. This also has an additional advantage in that an enhancement in image writing speed shortens the time required for the preparation of plate making and hence improves the operating efficiency of the printing machine.

The IR absorber used in the aforesaid coating fluid for printing plates in accordance with the present invention is contained in or attached to the aforesaid thermoplastic resin particles. It is desirable that the light absorptivity of the composite material consisting of this IR absorber and the thermoplastic resin particles has a peak at a wavelength of 800 to 850 nm and preferably about 830 nm. This is based on the reason that currently available IR writing apparatus have a wavelength of 830 nm.

Preferred materials for the aforesaid thermoplastic resin particles include, for example, acrylic resins such as styrene-(meth)acrylate copolymer, $\alpha$-methylstyrene-styrene-(meth) acrylate copolymer, (meth)acrylic acid and (meth)acrylic esters; styrene resins; styrene-acrylic resins such as styrene-(meth)acrylic acid, styrene-(meth)acrylic esters and α-methylstyrene-styrene-(meth)acrylic esters; urethane resins; phenolic resins; ethylene resins such as ethylene, ethylene-acrylic acid, ethylene-acrylic esters, ethylene-vinyl acetate resin and modified ethylene-vinyl acetate resin; and vinyl resins such as vinyl acetate, vinyl propionate, polyvinyl alcohol and polyvinyl ether.

Usable IR absorbers include, for example, the KAYASORB series (CY30(B), CY30(T),CY37 and IR-820(B)) manufactured by Nippon Kayaku Co., Ltd.; the EX COLOR series (HA-1, HA-10 and HA-14) manufactured by Nippon Shokubai Co., Ltd.; the SHIGENOX series (NIA-803W, NIA-809W and NIA-827H) manufactured by Hakkol Chemical K.K.; TW-1926 manufactured by Asahi Denka Co., Ltd.; and IRF-162 manufactured by Yamada Chemical Co., Ltd. However, it is to be understood that the present invention is not limited thereto.

In selecting an IR absorber, it is desirable to select an IR absorber which has a thermal decomposition temperature higher than the melt starting temperature of the resin and which has a high affinity for the resin and can hence be easily incorporated into the resin particles.

As the aforesaid carrier liquid, there may be used water or an organic solvent. The aforesaid thermoplastic resin particles are dispersed in this carrier liquid.

Figure 2:
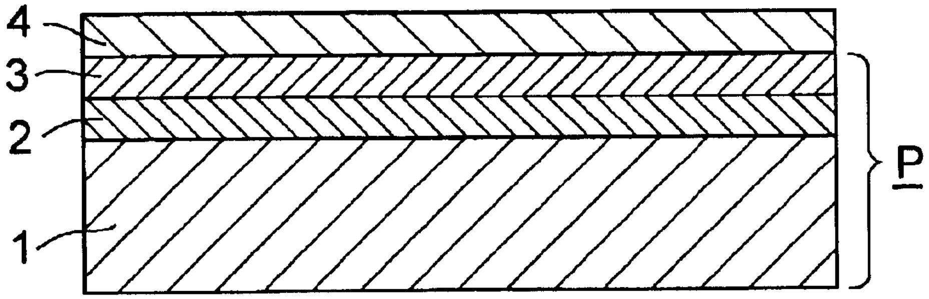
FIG. 2 is a cross-sectional view of a printing plate to which a coating fluid for printing plates in accordance with the present invention has been applied.

FIG. 2 shows a cross section of the surface part of an exemplary printing plate to which the aforesaid coating fluid for printing plates in accordance with the present invention is applied.

This printing plate (hereinafter referred to briefly as the "plate") P consists of a base material 1, an intermediate layer 2 and a coating layer 3. In this figure, a resin layer 4 as will be described later is formed on the surface of coating layer 3 (i.e., the plate surface).

Base material 1 comprises a metal such as aluminum or stainless steel, a polymer film, or the like. However, it is to be understood that base material 1 is not limited to a metal such as aluminum or stainless steel, or a polymer film.

Intermediate layer 2 is formed on the surface of base material 1. As the material of intermediate layer 2, there is used, for example, a silicone type compound such as silica ($SiO_2$), silicone resin or silicone rubber. In particular, usable silicone resins include silicone-alkyd, silicone-urethane, silicone-epoxy, silicone-acrylic, silicone-polyester and like resins. This intermediate layer 2 is formed in order to ensure the adhesion of a coating layer 3 (as will be described later) to base material 1 and to enhance its adhesion strength.

By disposing this intermediate layer 2 between base material 1 and coating layer 3 as required, it becomes possible to maintain a sufficient adhesion strength of coating layer 3. However, if a sufficient adhesion strength can be secured between base material 1 and coating layer 3, intermediate layer 2 may be omitted. Furthermore, where base material 1 comprises a polymer film or the like, this intermediate layer 2 may be formed to protect base material 1, as required.

On intermediate layer 2, a coating layer 3 containing a titanium dioxide photocatalyst as a photocatalyst is formed. When irradiated with ultraviolet radiation (hereinafter abbreviated as "UV") that is light of a wavelength having an higher energy than the band gap energy of the photocatalyst, the surface of this coating layer 3 is made highly hydrophilic. This quality is attributable to the properties possessed by the titanium dioxide photocatalyst.

Figure 3:
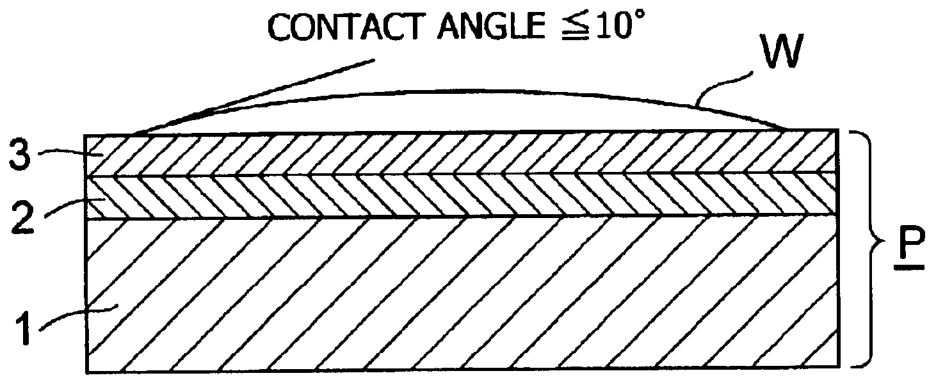
FIG. 3 is a cross-sectional view showing a state in which the plate surface exhibits hydrophilicity.

FIG. 3 illustrates a state in which, after an organic compound is removed from a non-image area, coating layer 3 exhibiting hydrophilicity as a result of UV irradiation is exposed. This exposure of coating layer 3 exhibiting hydrophilicity makes it possible to form a non-image area of printing plate P.

In order to maintain the aforesaid hydrophilic properties or in order to improve the strength of coating layer 3 or its adhesion to base material 1, this coating layer 3 may additionally contain the following substances. Such substances include, for example, silica type compounds such as silica, silica sol, organosilanes and silicone resins; metal oxides or hydroxides derived from zirconium, aluminum and the like; and fluorocarbon resins.

There are titanium dioxide photocatalysts of the rutile, anatase and brookite types, and any of them may be used in this embodiment. They may also be used in admixture. As will be described later, it is preferable that, in order to enhance the capability of the photocatalyst to decompose the organic compound under irradiation with UV having a higher energy than the band gap energy of the photocatalyst, the particle diameter of the titanium dioxide photocatalyst be small to some extent. Specifically, it is preferable that the particle diameter of the titanium dioxide photocatalyst be not greater than 0.1 μm.

Although titanium dioxide photocatalysts are suitable for use as the photocatalyst, the present invention is not limited thereto.

Specific examples of the titanium dioxide photocatalysts which are usable in the present invention and are sold on the market include ST-01 and ST-21, processed products such as ST-K01 and ST-K03, and water-dispersed type products such as STS-01, STS-02 and STS-21, all manufactured by Ishihara Sangyo Kaisha, Ltd.; SSP-25, SSP-20, SSP-M, CSB and CSB-M, and coating type products such as LACTI-01 and LACTI-03-A, all manufactured by Sakai Chemical Industry Co., Ltd.; TKS-201, TKS-202, TKC-301 and TKC-302, all manufactured by Tayca Corporation; and PTA, TO and TPX, all manufactured by Tanaka Tensha Co., Ltd. It is a matter of course that titanium dioxide photocatalysts other than the foregoing may also be used.

The thickness of coating layer 3 is preferably in the range of 0.01 to 10 μm. The reason for this is that if the thickness is unduly small, it will become difficult to make the most of the above-described properties, while if the thickness is unduly large, coating layer 3 will tend to be cracked and cause a reduction in plate wear resistance. Such cracking is frequently observed when the thickness exceeds 20 μm. Accordingly, even if the aforesaid range is relaxed, it is necessary to recognize 20 μm as its upper limit. In practice, it is more preferable that the thickness be in the range of about 0.1 to 3 μm.

This coating layer 3, can be formed by a sol coating process, organic titanate process, vapor deposition process or the like.

The aforesaid resin layer 4 has both the property of reacting with or adhering strongly to the surface of coating layer 3 (i.e., the plate surface) as a result of heat treatment and the property of being decomposed by the action of a photocatalyst when irradiated with UV having a higher energy than the band gap energy of the photocatalyst.

Now, the methods of making and regenerating printing plate P in accordance with the present invention are described below. The method of making printing plate P comprises "a hydrophobizing agent application step", "an image writing step" and "a hydrophobizing agent removal step".

Figure 4:
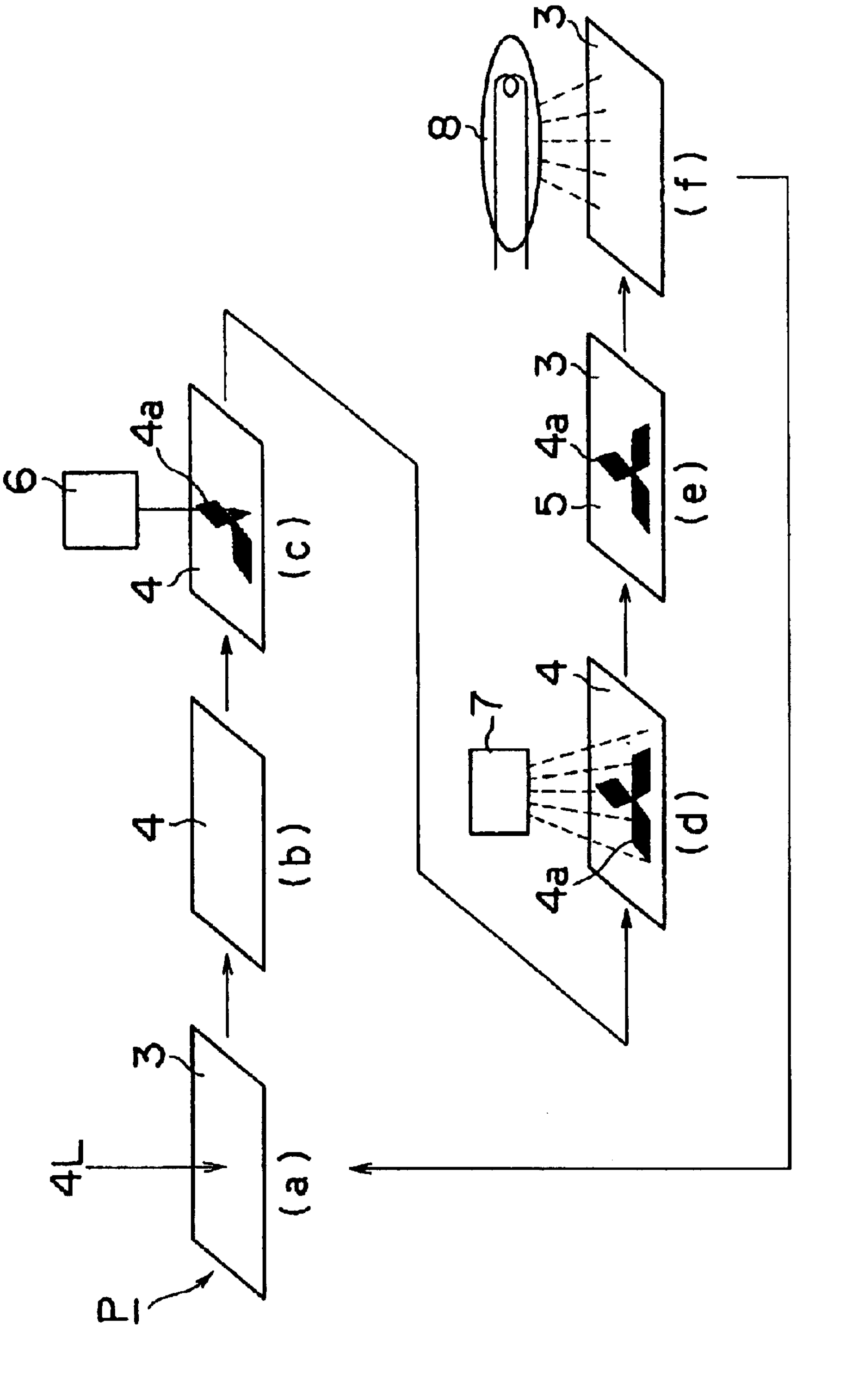
FIG. 4 is a schematic view showing the procedures for plate making and plate regeneration.

FIG. 4 diagrammatically illustrates the procedures for making and regenerating printing plate P. The term "plate making" as used herein refers to a process in which the coating fluid for printing plates in accordance with the present invention is applied to a plate surface, at least a part of the plate surface is heat-treated on the basis of digital data to form a hydrophobic image area, and the aforesaid organic compound is removed from the part of the plate surface that has not been heat-treated.

First of all, the surface of coating layer 3 is irradiated with light of a wavelength having a higher energy than the band gap energy of the titanium dioxide photocatalyst (e.g., UV having a wavelength of not greater than 380 nm). Thus, a state illustrated in FIG. 3, i.e. a state in which the entire surface of printing surface P is a hydrophilic surface having a contact angle of water W of not greater than 10°, is created.

Then, as the hydrophobizing agent application step, the aforesaid coating fluid for printing plates in accordance with the present invention (represented by the symbol 4L in this figure) is applied to the hydrophilic surface of coating layer 3. If necessary, this coating fluid is dried at a temperature in the vicinity of room temperature to create a state illustrated in FIG. 2, i.e. a state in which a resin layer 4 is formed on coating layer 3.

FIG. 4(*a*) illustrates a state in which the aforesaid coating fluid containing an organic compound has been applied, and FIG. 4(*b*) illustrates a state in which the aforesaid coating fluid has been dried at an ordinary temperature in the vicinity of room temperature.

This state of the surface of coating layer 3 is called "the initial state for plate making". The aforesaid "initial state for plate making" can be regarded as the state in which an actual printing step is started. More specifically, this refers to the state in which digital data for any given image is already provided and it is intended to write the data on the plate surface.

As the image writing step, an image is written on the surface of coating layer 3 coated with the aforesaid resin layer 4 to form an image area.

This image area is formed so as to correspond to digital date for the image. The term "image area" as used herein means a hydrophobic area in which the contact angle of water is not less than 50° and preferably not less than 80°. The state of this image area is such that a hydrophobic printing ink adheres easily thereto, but the adhesion of a dampening solution is difficult.

A preferred method for creating such a hydrophobic image area on the basis of image data is to heat resin layer 4 and thereby cause the aforesaid organic compound to react with or adhere strongly to coating layer 3. After the image area is heated, the organic compound is removed from the unheated part (i.e., the part other than the hydrophobic image area) to create a non-image area. Thus, a printing plate can be made.

In order to heat resin layer 4, it is irradiated with IR having an energy lower than the band gap energy of the photocatalyst. This IR irradiation can cause the thermoplastic resin particles contained in the coating fluid to react with or adhere strongly to coating layer 3, without decomposing them.

In this embodiment, as illustrated in FIG. 4(*c*), at least a part of resin layer 4 is heated by IR irradiation using an infrared writing head 6. Consequently, the thermoplastic resin particles react with or adhere strongly to the surface of coating layer 3 to form an image area 4*a*.

After the formation of image area 4*a*, as illustrated in FIG. 4(*d*), water or a cleaning fluid containing water is sprayed over organic compound layer 4 by means of a cleaning spray 7. Thus, organic compound layer 4 is cleaned and removed from the unheated part to create a non-image area 5. Consequently, as illustrated in FIG. 4(*e*), the formation of image area 4*a* and non-image area 5 on the surface of coating layer 3 is completed, and the plate is ready for printing.

Figure 5:
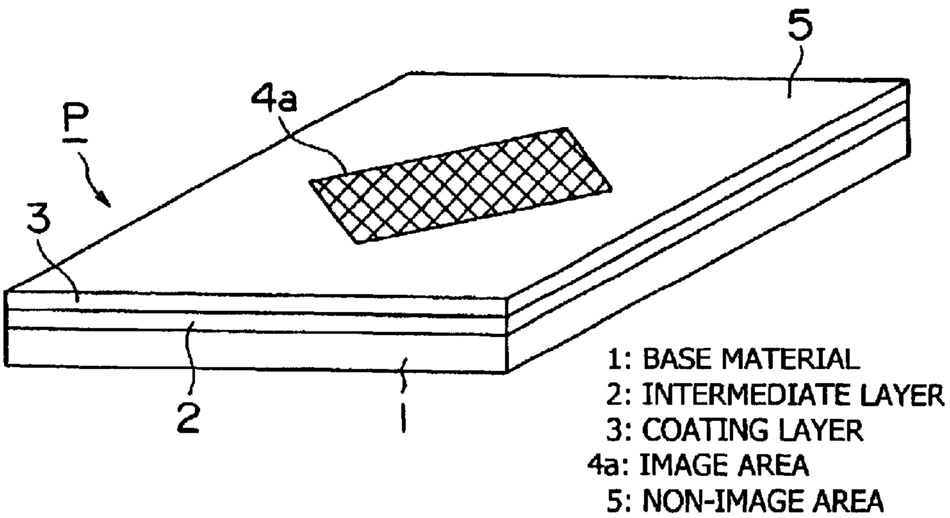
FIG. 5 is a perspective view showing an exemplary image (or image area) written on a plate surface and a background area (or non-image area)

After the above-described treatment has been completed, a mixture of a hydrophobic printing ink and a dampening solution is spread over the surface of coating layer 3. Thus, a printing plate P, for example, as illustrated in FIG. 5 is made.

In this figure, the shaded part represents the part formed by causing the thermoplastic resin contained in the coating fluid to react with or adhere strongly to the surface of coating layer 3 containing the photocatalyst, i.e. the state in which the hydrophobic ink has adhered to the hydrophobic image area 4*a*. In the remaining background part, i.e. the hydrophilic non-image area 5, the dampening solution has preferentially adhered thereto, but the hydrophobic ink has been repelled instead of adhering thereto. The fact that such an image has emerged indicates that the surface of coating layer 3 functions as a printing plate.

Subsequently, an ordinary printing step is performed and finished.

Now, the method of regenerating printing plate P is explained below.

The term "plate regeneration" as used herein means a process in which the plate surface exhibiting hydrophobicity in at least a part thereof and hydrophilicity in the remainder thereof is restored to its "initial state for plate making" by making the entire surface uniformly hydrophilic, applying the aforesaid coating fluid for printing plates to this hydrophilic plate surface, and drying the coating fluid at a temperature in the vicinity of room temperature as required.

First of all, as an ink removal step, the ink, dampening solution, paper dust and other contaminants adhering to the surface of coating layer 3 having been subjected to the printing step are wiped off. Thereafter, as a regeneration step, the entire surface of coating layer 3 exhibiting hydrophobicity in at least a part thereof is irradiated with light having a higher energy than the band gap energy of the photocatalyst.

Thus, the thermoplastic resin forming image area 4*a* can be decomposed and removed to create a state in which the entire surface of coating layer 3 is a hydrophilic surface having a contact angle of water in the vicinity of 10°, i.e. the state illustrated in FIG. 3.

The fact that the thermoplastic resin particles present on the surface of coating layer 3 can be decomposed and removed by irradiation with light of a wavelength having a higher energy than the band gap energy of the photocatalyst (e.g., ultraviolet radiation) and the resulting surface is highly hydrophilic, is attributable to the properties possessed by the titanium dioxide photocatalyst. As shown in FIG. 4(*f*), an ultraviolet lamp 8 is used in this embodiment, so that the organic compound forming image area 4*a* is decomposed solely by ultraviolet irradiation to expose the surface of coating layer 3*a*, i.e. the hydrophilic surface.

To the surface of coating layer 3 which has entirely restored its hydrophilicity by ultraviolet irradiation, coating fluid 4L containing thermoplastic resin particles is applied again at ordinary temperature. Then, coating fluid 4L is dried at a temperature in the vicinity of room temperature as required. Thus, printing plate P can be restored to its initial state for plate making.

Moreover, the step of decomposing the aforesaid thermoplastic resin particles by irradiating the entire surface of coating layer 3 with light having a higher energy than the band gap energy of the photocatalyst and the step of cleaning the surface of coating layer 3 with water or a cleaning fluid containing water may be repeated alternately. Thus, the entire surface of coating layer 3 can be more easily returned to a hydrophilic surface having a contact angle of water in the vicinity of 10°.

The aforesaid thermoplastic resin particles should preferably be such that, while they react with or adhere strongly to a hydrophilic part of the plate surface by the application of heat and thus function to impart hydrophobicity to the hydrophilic surface, such reaction or adhesion does not substantially occur at ordinary temperatures and, moreover, they are easily decomposed under ultraviolet irradiation by the action of the titanium dioxide photocatalyst.

Figure 6:
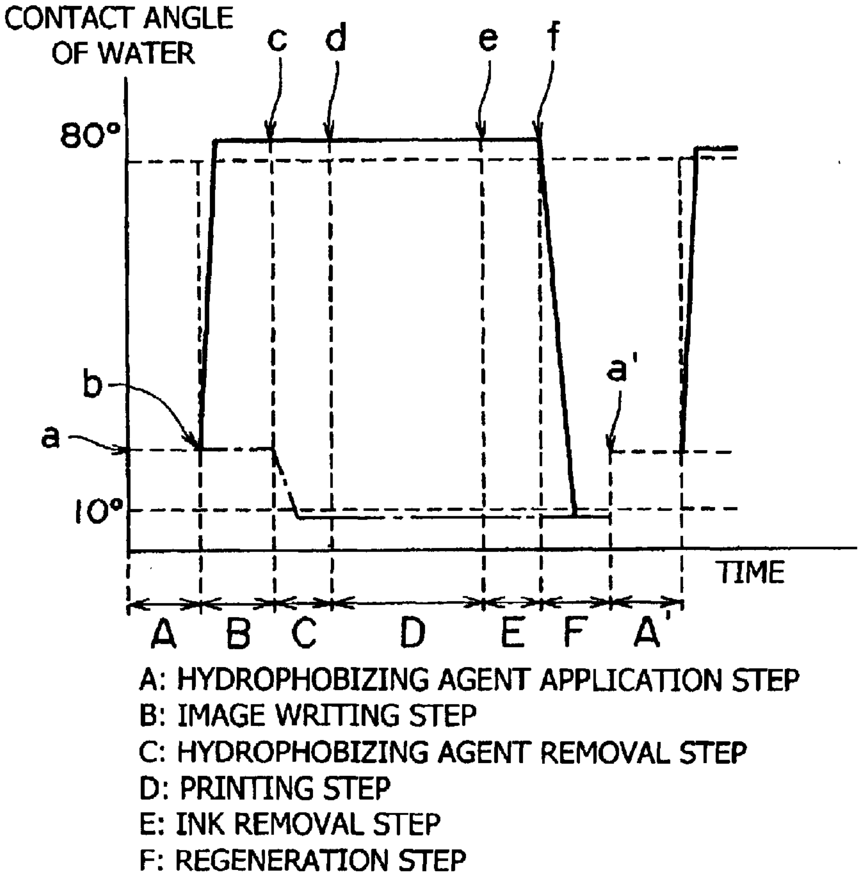
FIG. 6 is a graph in which a process comprising the formation of an image area by the application of an organic compound to a hydrophilic plate surface and, after completion of the printing, the elimination of the image area by ultraviolet irradiation is shown as a function of time.

The above description is summarized in a graph shown in FIG. 6. This is a graph in which time (or a sequence of operations) is plotted on the abscissa and the contact angle of water on the ordinate, and indicates how the contact angle of the surface of coating layer 3 in printing plate P (i.e., its hydrophobic or hydrophilic state) changes with time or according to various operations. In this figure, an alternate long and short dash line represents the surface of coating layer 3 or non-image area 5, and a solid line represents image area 4.

First of all, the surface of coating layer 3 is irradiated with ultraviolet radiation so that the surface of coating layer 3 exhibits high hydrophilicity as characterized by a contact angle of water in the vicinity of 10° and preferably not greater than 10°. At first, as a hydrophobizing agent application step (step A), the aforesaid coating fluid for printing plates in accordance with the present invention (i.e., a hydrophobizing agent) is applied to the surface of coating layer 3 (point a). Thereafter, this fluid is dried at an ordinary temperature in the vicinity of room temperature as required. It is to be understood that this figure illustrates a case in which such a drying step is not required. The state in which the application of the fluid containing an organic compound is completed is "the initial state for plate making".

Next, as an image writing step (step B), the writing of an image area is started by heating that part of the coating fluid applied to the surface of coating layer 3 which corresponds to an image area (point b). Thus, the organic compound reacts with or adheres strongly to the surface of coating layer 3, so that the image area comes to exhibit high hydrophobicity. On the other hand, the thermoplastic resin particles contained in the coating fluid do not substantially react with or adhere strongly to the plate surface in a non-image area, so that the non-image area retains the same state as before the image writing.

After the image writing has been completed, as a hydrophobizing agent removal step (step C), the coating fluid is removed from the non-image area of the surface of coating layer 3 by a technique such as cleaning (point c). That is, the hydrophilic surface of coating layer 3 is exposed as non-image area 5. Thus, the surface of coating layer 3 has a hydrophobic image area formed by the reaction or strong adhesion of thermoplastic resin particles contained in the coating fluid, and a hydrophilic non-image area from which the resin has been removed, and can hence function as a printing plate.

After completion of the removal of the coating fluid from non-image area 5, printing is started as a printing step (step D) (point d).

After the printing is finished, as an ink removal step (step E), cleaning is started by wiping off the ink and other contaminant adhering to the surface of coating layer 3 (point e).

After completion of the cleaning (i.e., the wiping-off of the ink), the irradiation of the surface of coating layer 3 with ultraviolet radiation is started as a regeneration step (step F). Thus, the aforesaid thermoplastic resin particles forming image area 4*a* are decomposed and removed to restore the surface of coating layer 3 to its hydrophilic state.

Thereafter, as a second hydrophobizing agent application step (step A'), the aforesaid coating fluid is applied again (point a'). Thus, this printing plate P is returned to its "initial state for plate making" and can hence be reused.

The procedures for plate making and plate regeneration as embodied in the methods of making and regenerating a printing plate in accordance with the present invention are more fully explained with reference to the following examples.

More specific examples concerned with the methods of making and regenerating a printing plate, which were confirmed by the present inventors, are given below.

[Example Concerned with the Method of Making a Printing Plate]

(1) First of all, a base material 1 (plate substrate) made of stainless steel (SUS 304) and having an area of 280 mm×204 mm and a thickness of 0.1 mm was provided. This plate substrate was dip-coated with a silica sol having a solid content of 5% by weight, and then heat-treated at 500° C. for 30 minutes to form an intermediate silica layer having a thickness of about 0.07 μm.

(2) The aforesaid plate substrate having the intermediate layer was dip-coated with a titanium dioxide coating composition (TKC-301, manufactured by Tayca Corporation) and heated at 500° C. to form an anatase type titanium dioxide photocatalyst layer on the plate surface. The thickness of the photocatalyst layer was about 0.1 μm.

(3) Using a low-pressure mercury vapor lamp, the entire plate surface was irradiated with ultraviolet radiation having a wavelength of 254 nm and an illuminance of 20 $mW/cm^2$ for 10 seconds. With respect to the part having undergone ultraviolet irradiation, the contact angle of water was immediately measured with a CA-W type contact angle meter. The contact angle was 7°, which indicated that this part was sufficiently hydrophilic for a non-image area.

(4) A styrene-acrylic resin (manufactured and sold by Johnson Polymer Co. under the trade name of "HPD-671") was dissolved in ethanol to prepare a resin solution having a concentration of 1% by weight. To this resin solution were added a surface-active agent (Ionet T-60-C, manufactured by Sanyo Chemical Industries, Ltd.) in an amount of 10% by weight based on the resin and, moreover, an IR absorber (KAYASORB CY-37, manufactured by Nippon Kayaku Co., Ltd.) in an amount of 3% by weight based on the resin. Then, fine resin particles were precipitated by adding 50 parts of (cold) ion-exchanged water to 50 parts of the aforesaid resin solution.

Thereafter, using an evaporator, ethanol was distilled off at a liquid temperature of 40° C. Thus, an aqueous dispersion of fine thermoplastic resin particles was prepared for use as a hydrophobizing agent. When the resin particles were observed with a scanning electron microscope, they were spherical particles having a diameter of 0.07 to 0.1 μm. The melt starting temperature of the resin HPD-671 was 173° C. (a value announced by the manufacturer), and the decomposition starting temperature of the IR absorber KAYASORB CY-37 was 210° C. (a value announced by the manufacturer).

(5) The entire surface which had been made hydrophilic by ultraviolet irradiation was roll-coated with the aforesaid hydrophobizing agent, followed by air drying at 25° C. for 5 minutes. Then, dot images with dot percentages ranging from 10% to 100% in increments of 10% were written on the plate surface at a writing speed of 3 m per second by means of an image writing apparatus using an infrared laser with a wavelength of 830 nm, an output of 250 mW, and a beam diameter of 15 μm. Thus, the fine resin particles present in the irradiated part are melted by heating and made to adhere strongly to the plate surface, so that a film layer (or organic compound layer) 4 was formed.

With respect to this part having fine resin particles adhering strongly thereto, the contact angle of water was measured with a CA-W type contact angle meter. The contact angle was 82°, which indicated that an image area was formed.

(6) This plate was mounted on a desktop offset printing machine (New Ace Pro, manufactured by Alpha Engineering Inc.). Then, using HYECOO B Red MZ (an ink manufactured by Toyo Ink Mfg. Co., Ltd.) and a 1% Lithofellow solution (a dampening solution manufactured by Mitsubishi Heavy Industries, Ltd.; a trademark), printing on Eyebest paper (coated thick paper made by Japan Paperboard Industries, Co., Ltd.; a trademark) was started at a printing speed of 3,500 copies per hour.

In the first 5 copies after the start of the printing, not only the image area was printed, but also some parts of the non-image area were stained because the ink adhered partially to the non-image area which was intended to repel the ink. However, the stains disappeared gradually and the intended non-image area was obtained on the 10th copy. Thus, the dot images could be printed on the paper. That is, it was confirmed that the thermoplastic resin particles present in the non-image area were removed from the plate surface by the adhesive power of the ink and/or the cleaning effect of the dampening solution.

[Example Concerned with the Method of Regenerating a Printing Plate]

After completion of the printing, the ink, dampening solution, paper dust and other contaminants adhering to the plate surface were completely wiped off. Then, using a low-pressure mercury vapor lamp, the entire plate surface was irradiated with ultraviolet radiation having a wavelength of 254 nm and an illuminance of 20 $mW/cm^2$ for 20 seconds. With respect to the part on which the dot images had been written, the contact angle of water was immediately measured with a CA-W type contact angle meter. The contact angle was 8°, which indicated that this part was sufficiently hydrophilic. That is, it was confirmed that the plate was returned to its state prior to the application of the hydrophobizing agent and plate regeneration could be achieved.

COMPARATIVE EXAMPLE

A hydrophobizing agent was prepared in the same manner as in the foregoing Example, except that the IR absorber KAYASORB CY-37 (manufactured by Nippon Kayaku Co., Ltd.) was replaced by the IR absorber KAYASORB IR-820 (B) (manufactured by Nippon Kayaku Co., Ltd.).

The decomposition starting temperature of KAYASORB IR-820(B) was 140° C. (a value announced by the manufacturer). Using this hydrophobizing agent, image writing and printing were carried out in the same manner as in the foregoing Example. In the first 5 copies after the start of the printing, not only the image area was printed, but also some parts of the non-image area were stained because the ink adhered partially to the non-image area which was intended to repel the ink. However, the stains disappeared gradually and no image was printed on the 10th copy.

That is, it was confirmed that not only the thermoplastic resin particles present in the non-image area were removed from the plate surface by the adhesive power of the ink and/or the cleaning effect of the dampening solution, but also the hydrophobizing agent present in the part having images written with IR was removed because the thermoplastic resin particles did not melt to a sufficient extent to adhere strongly to the plate.

What is claimed is:

1. A coating fluid for printing plates comprising: a carrier liquid and composite resin particles comprising a thermoplastic resin and an IR absorber, wherein said IR absorber has a decomposition starting temperature higher than the melt starting temperature of said thermoplastic resin particles.

2. The coating fluid for printing plates as claimed in claim 1 wherein light absorptivity of said composite resin particles, has a peak at a wavelength of 800 to 850 nm.

3. The coating fluid for printing plates as claimed in claim 2, wherein said light absorptivity has a peak at a wavelength of about 830 nm.

* * * * *